United States Patent
Behzad

(10) Patent No.: US 8,224,270 B2
(45) Date of Patent: Jul. 17, 2012

(54) METHOD AND SYSTEM FOR OPTIMIZING TRANSMIT POWER OF A POWER AMPLIFIER USING A BATTERY VOLTAGE (VBAT) MONITOR

(75) Inventor: Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 857 days.

(21) Appl. No.: 11/618,195

(22) Filed: Dec. 29, 2006

(65) Prior Publication Data
US 2008/0139146 A1 Jun. 12, 2008

Related U.S. Application Data

(60) Provisional application No. 60/868,818, filed on Dec. 6, 2006.

(51) Int. Cl.
*H04B 1/04* (2006.01)
(52) U.S. Cl. ........ 455/127.2; 455/247.1; 455/234.1; 455/234.2; 455/232.1; 455/250.1; 375/142; 375/345
(58) Field of Classification Search ........ 455/127.2, 455/247.1, 234.1, 234.2, 232.1, 250.1; 375/345, 375/142
See application file for complete search history.

(56) References Cited

U.S. PATENT DOCUMENTS

| | | | |
|---|---|---|---|
| 5,192,919 A | | 3/1993 | Wieczorek |
| 5,774,797 A | | 6/1998 | Kawano et al. |
| 5,924,015 A | * | 7/1999 | Garrison et al. ........ 455/13.4 |
| 6,018,232 A | * | 1/2000 | Nelson et al. ........ 320/127 |
| 6,871,050 B2 | * | 3/2005 | Wahl ........ 455/127.2 |
| 7,151,759 B1 | * | 12/2006 | Ryan et al. ........ 370/332 |
| 7,457,617 B2 | * | 11/2008 | Adams et al. ........ 455/418 |
| 7,460,842 B2 | * | 12/2008 | Black et al. ........ 455/127.1 |
| 7,558,546 B2 | * | 7/2009 | Johnson et al. ........ 455/182.3 |
| 2004/0266470 A1 | * | 12/2004 | Di Camillo et al. ........ 455/522 |

FOREIGN PATENT DOCUMENTS

| | | |
|---|---|---|
| CN | 1406411 A | 3/2003 |
| CN | 1451218 | 10/2003 |
| CN | 1813401 A | 8/2006 |
| DE | 100 02 523 | 8/2001 |

(Continued)

OTHER PUBLICATIONS

European Search Report corresponding to European Patent Application Serial No. 07013827.6-2215, dated Jun. 17, 2009.

(Continued)

*Primary Examiner* — Sanh Phu
(74) *Attorney, Agent, or Firm* — Thomas, Kayden, Horstemeyer & Risley LLP.

(57) ABSTRACT

Methods, systems, and machine-readable code for optimizing transmit power of a power amplifier using a $V_{bat}$ monitor are disclosed and may comprise adjusting the gain of gain stages in a transmit path based on a control signal that is a function of a supply voltage signal, among other variables, derived from a supply voltage that may be used to power a transmit path. The supply voltage signal may be received from a power management unit or derived directly from a battery or other supply. The supply voltage signal may be compared to a reference signal, the result of which may be utilized to generate the control signal. The values for the control signals may be determined over a range of supply voltages and stored in a lookup table.

29 Claims, 4 Drawing Sheets

FOREIGN PATENT DOCUMENTS

| | | |
|---|---|---|
| EP | 0 689 323 | 12/1995 |
| EP | 0 735 690 | 10/1996 |
| KR | 10 2005 0061948 | 6/2005 |
| KR | 10 2005 0070605 | 7/2005 |
| WO | WO 2004/068704 | 8/2004 |

OTHER PUBLICATIONS

Taiwanese Official Action for copending application No. 100210944801, mailed Nov. 30, 2011.

* cited by examiner

METHOD AND SYSTEM FOR OPTIMIZING TRANSMIT POWER OF A POWER AMPLIFIER USING A BATTERY VOLTAGE (VBAT) MONITOR

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

The above stated application is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to controlling of circuits utilized in communication devices. More specifically, certain embodiments of the invention relate to a method and system for optimizing transmit power of a power amplifier using a battery voltage (Vbat) monitor.

BACKGROUND OF THE INVENTION

A power amplification circuit in a wireless system is typically a large signal device. In wireless local area network (WLAN) systems, the power amplifier (PA) circuit may transmit output signals at average power levels in the range of 10 dBm to 20 dBm, and peak power levels of about 20 to 30 dBm, for example. In such WLAN systems, which may, for example, utilize a wide range of modulation types from binary phase shift keying (BPSK) to 512 level quadrature amplitude modulation (512-QAM), output power levels may vary widely such that the ratio of the peak power level to the average power level may be large, for example, 10 dBm to 15 dBm.

The power output of a PA may be affected by the battery level. In instances where a PA may be designed to operate at a particular voltage, when the battery voltage may be higher or lower than that particular voltage, the PA performance may degrade. In other words, when a voltage level of the battery which is utilized to power the transmitter containing the PA varies, the performance of the PA also varies. Linearity, output power, adjacent channel power ratio (ACPR) and error vector magnitude (EVM) may be adversely affected by operating the PA at different bias levels.

Limitations in the performance of PA circuitry may be exacerbated when the PA is integrated in a single integrated circuit (IC) device with other radio frequency (RF) transmitter circuitry such as digital to analog converters (DAC), low pass filters (LPF), mixers, and RF programmable gain amplifiers (RFPGA). Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification. Requirements for AM-AM and/or AM-PM distortion levels as set forth in a WLAN standard, such as IEEE 802.11, may preclude transmitting output signals at high output power levels for PA circuitry that is fabricated utilizing a 65 nm CMOS process, for example.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for optimizing transmit power in a power amplifier utilizing a battery voltage (Vbat) monitor, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for optimizing transmit power of a power amplifier using a battery voltage ($V_{bat}$) monitor. Aspects of the invention may comprise adjusting a gain of one or more gain stages in a transmit path based on a control signal that is a function of a battery voltage signal derived from a battery voltage that may be used to power a transmit path. The battery voltage signal may be received from a power management unit or derived directly from the battery. The battery voltage signal may be compared to a reference signal, and the results of the comparison may be utilized to generate the control signal. The values for the control signals may be determined over a range of battery voltages and stored in a lookup table.

Figure 1A:
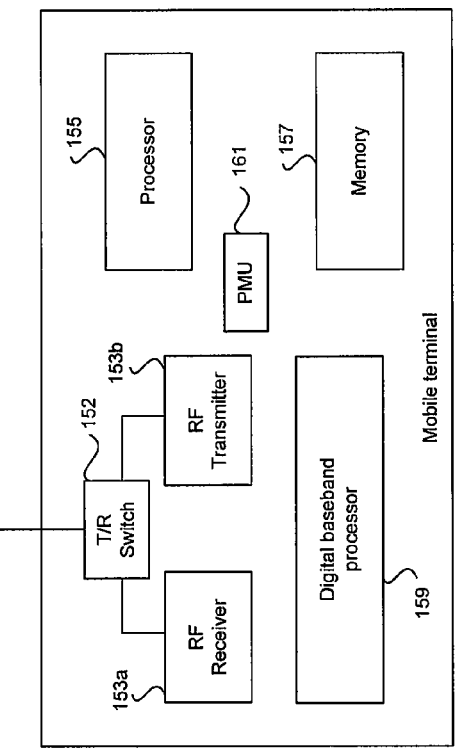
FIG. 1A is a block diagram illustrating an exemplary mobile terminal, which may be utilized in connection with an embodiment of the invention.

FIG. 1A is a block diagram illustrating an exemplary mobile terminal, which may be utilized in connection with an embodiment of the invention. Referring to FIG. 1A, there is shown mobile terminal 150 that may comprise an RF receiver 153a, an RF transmitter 153b, a T/R switch 152, a digital baseband processor 159, a processor 155, a power management unit (PMU) 161 and a memory 157. An antenna 151 may be communicatively coupled to the T/R switch 152. In instances when the T/R switch 152 is set to "R", or receive, the antenna 151 may be communicatively coupled to the RF receiver 153a, and in instances when the T/R switch 152 is set to "T", or transmit, the antenna 151 may be communicatively coupled to the RF transmitter 153b.

The RF receiver 153a may comprise suitable logic, circuitry, and/or code that may enable processing of received RF signals. The RF receiver 153a may enable receiving of RF signals in frequency bands utilized by various wireless communication systems, such as Bluetooth, WLAN, GSM, and/or WCDMA, for example.

The digital baseband processor 159 may comprise suitable logic, circuitry, and/or code that may enable processing and/or handling of baseband signals. In this regard, the digital baseband processor 159 may process or handle signals received from the RF receiver 153a and/or signals to be transferred to the RF transmitter 153b for transmission via a wireless communication medium. The digital baseband processor 159 may also provide control and/or feedback information to the RF receiver 153a and to the RF transmitter 153b, based on information from the processed signals. The digital baseband processor 159 may communicate information and/or data from the processed signals to the processor 155 and/or to the memory 157. Moreover, the digital baseband processor 159 may receive information from the processor 155 and/or the memory 157, which may be processed and transferred to the RF transmitter 153b for transmission to the wireless communication medium.

The RF transmitter 153b may comprise suitable logic, circuitry, and/or code that may enable processing of RF signals for transmission. The RF transmitter 153b may enable transmission of RF signals in frequency bands utilized by various wireless communications systems, such as Bluetooth, WLAN, GSM and/or WCDMA, for example.

The processor 155 may comprise suitable logic, circuitry, and/or code that may enable control and/or data processing operations for the mobile terminal 150. The processor 155 may be utilized to control at least a portion of the RF receiver 153a, the RF transmitter 153b, the digital baseband processor 159, and/or the memory 157. In this regard, the processor 155 may generate at least one signal for controlling operations within the mobile terminal 150.

The memory 157 may comprise suitable logic, circuitry, and/or code that may enable storage of data and/or other information utilized by the mobile terminal 150. For example, the memory 157 may be utilized for storing processed data generated by the digital baseband processor 159 and/or the processor 155. The memory 157 may also be utilized to store information, such as configuration information, that may be utilized to control the operation of at least one block in the mobile terminal 150. For example, the memory 157 may comprise information necessary to configure the RF receiver 153a to enable receiving RF signals in the appropriate frequency band.

The power management unit 161 may comprise suitable logic, circuitry, and/or code that may enable the management of the power requirements of the components within the mobile terminal 150. The PMU 161 may generate a battery voltage signal, $V_{bat}$.

Figure 1B:
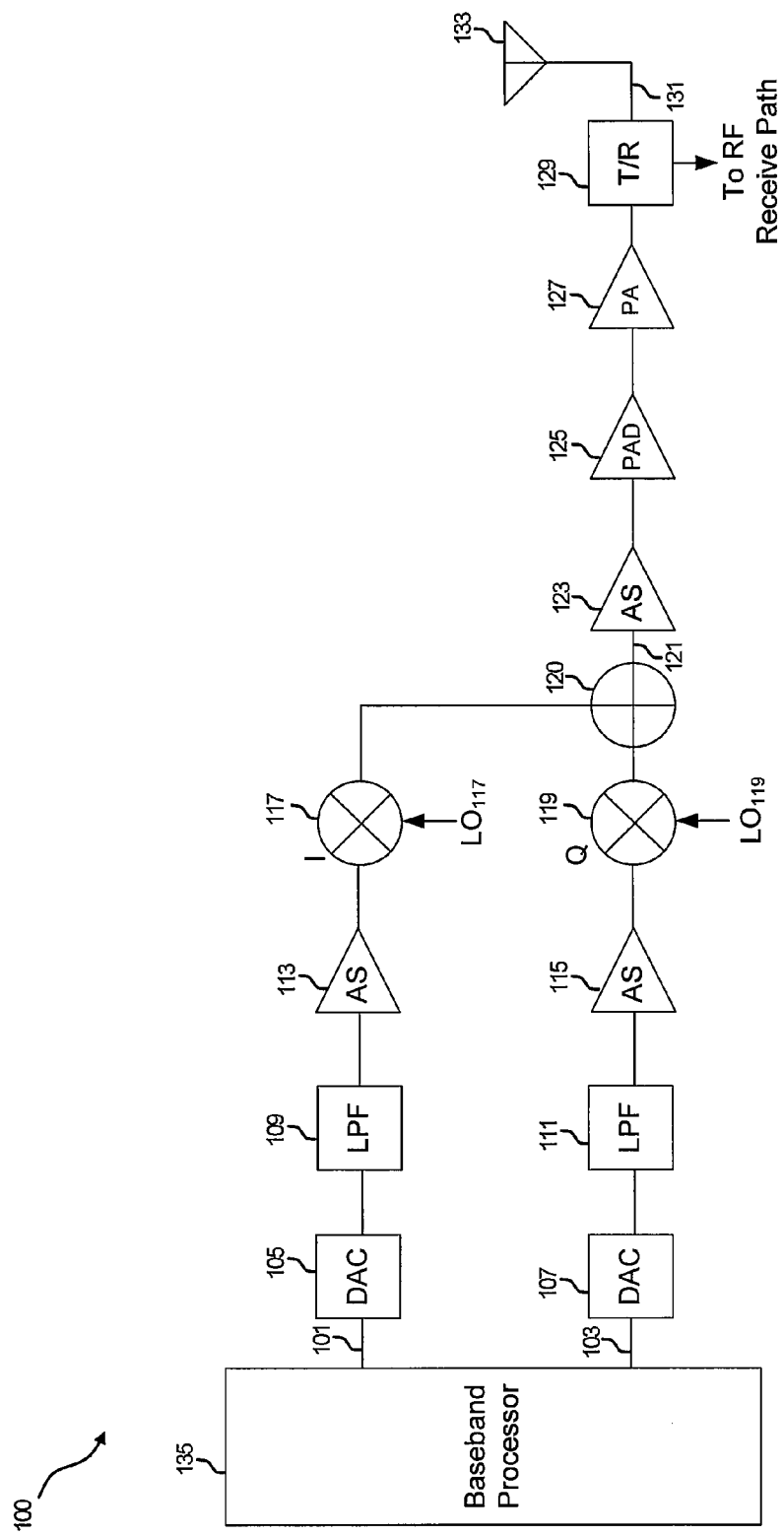
FIG. 1B is a block diagram of an exemplary I and Q transmit path, in accordance with an embodiment of the invention.

FIG. 1B is a block diagram of an exemplary I and Q transmit path, in accordance with an embodiment of the invention. Referring to FIG. 1B, there is shown transmit path 100 comprising digital to analog converters (DAC) 105 and 107, low pass filters 109 and 111, active stages (as) 113, 115, and 123, in-phase and quadrature up-conversion mixers 117 and 119, respectively, an adder 120, a power amplifier driver (PAD) 125, a power amplifier (PA) 127, a transmit/receive (T/R) switch 129, and an antenna 133. The in-phase path comprises the DAC 105, the LPF 109, the AS 113 and the in-phase up-conversion mixer 117. The quadrature path comprises the DAC 107, the LPF 111, the AS 115 and the quadrature up-conversion mixer 119. The exemplary transmitter 100 of FIG. 1B may be representative of the RF transmitter 153b of FIG. 1A.

The DAC 105 may comprise suitable circuitry, logic and/or code for converting a digital signal to an analog output. The DAC 105 may be enabled to receive an input signal, namely in-phase digital IF signal 101. The input digital signal may comprise one or more bits, which may represent a numerical value. The input digital signal may be a baseband signal, which may be mapped to a constellation point based on a modulation type. The mapped constellation point may be represented by an analog signal amplitude. The number of bits represented by an analog signal amplitude, or symbol, may be determined based on the modulation type. The DAC 105 may be enabled to generate an analog output signal, which may be communicated to an input of the low pass filter 109. The DAC 107 may be substantially similar to the DAC 105. Notwithstanding, the DAC 107 may be enabled to receive an input signal 103 from the baseband processor 135, and accordingly, generate an analog signal, which may be communicated to an input of the low pass filter 111.

The LPF 109 may comprise suitable circuitry, logic and/or code that may enable selection of a cutoff frequency, wherein the LPF 109 may attenuate the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the LPF 109 may be implemented as a passive filter, such as one that utilizes resistor, capacitor, and/or inductor elements, or implemented as an active filter, such as one that utilizes an operational amplifier. The LPF 111 may be substantially similar to LPF 109. Notwithstanding, the LPF 111 may be enabled to receive an analog input signal from the DAC 107, and accordingly, generate a low pass filtered signal, which may be communicated to an input of the active stage 115.

The AS 113 may comprise suitable circuitry, logic and/or code that may enable attenuation of input signals to generate an attenuated output signal. The amount of attenuation that may be provided by the AS 113, as measured in dB for example, may be determined based on an input control signal, which may be generated by the processor 155 described with respect to FIG. 1A. The AS 113 may be enabled to receive an output signal generated by the LPF 109. The AS 113 may be enabled to generate an output signal with applied gain or attenuation that may be communicated to the in-phase up-conversion mixer 117. The AS 115 may be substantially similar to the AS 113. Notwithstanding, an input of the AS 115 may be coupled to an output of the low pass filter 111 and an output of the AS 115 may be coupled to an input of the mixer 119.

The in-phase up-conversion mixer 117 may comprise suitable circuitry, logic and/or code may enable generation of an RF signal by modulation of an input signal. The in-phase up-conversion mixer 117 may utilize an input local oscillator signal labeled as LO117 to modulate the input signal. The modulated signal may be an RF signal. The transmitter in-phase up-conversion mixer 117 may produce an RF signal for which the carrier frequency may be approximately equal to the frequency of the signal LO117. The in-phase up-conversion mixer 117 may be enabled to receive an output signal generated by the active stage 113 and to generate an output signal that may be communicated to the active stage 123. The quadrature up-conversion mixer 119 may be substantially similar to in-phase up-conversion mixer 117. Notwithstanding, an input of the quadrature up-conversion mixer 119 may be coupled to an output of the AS 115.

The adder 120 may comprise suitable circuitry, logic and/or code for receiving analog input signals and generating an output signal that may be a sum of the incoming signals. The adder 120 may be enabled to receive output signals generated by the in-phase up-conversion mixer 117 and quadrature up-conversion mixer 119, resulting in the signal 121.

The AS 123 may comprise suitable circuitry, logic and/or code that may enable attenuation of input signals to generate an attenuated output signal. The amount of attenuation that may be provided by the AS 123, as measured in dB for example, may be determined based on an input control signal, which may be generated by the processor 155 described with respect to FIG. 1A. The AS 123 may be enabled to receive an output signal generated by the adder 120. The AS 123 may be enabled to generate an output signal with applied gain or attenuation that may be communicated to the PAD 125.

The PAD 125 may comprise suitable circuitry, logic and/or code for receiving analog input signals and generating an output signal for driving a power amplifier. The PAD 125 may receive as inputs, control signals, which may be generated by the processor 155. The received control signal may be utilized to set a gain or attenuation level of the PAD 125. The PAD 125 may be enabled to receive the output signal generated by the AS 123. The PAD 125 may be enabled to generate an output signal that may be communicated to the PA 127.

The PA 127 may comprise suitable circuitry, logic and/or code that may enable amplification of input signals to generate a transmitted signal of sufficient signal power (as measured by dBm, for example) for transmission via a wireless communication medium. The PA 127 may receive as inputs, control signals, which may be generated by the processor 155. The received control signal may be utilized to set a gain or attenuation level of the PAD 127.

The transmit/receive (T/R) switch 129 may comprise suitable circuitry, logic and/or code for switching the antenna 133 between the transmit path 100 and an RF receiver. The antenna 133 may comprise suitable circuitry for transmitting or receiving an RF signal.

The baseband processor 135 may comprise suitable logic, circuitry, and/or code that may enable processing of binary data contained within an input baseband signal. The baseband processor 135 may be substantially similar to the digital baseband processor 159 described with respect to FIG. 1A. The baseband processor 135 may perform processing tasks, which correspond to one or more layers in an applicable protocol reference model (PRM). For example, the baseband processor 135 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the baseband processor 135 may be referred to as being within the digital domain. The baseband processor 135 may also generate control signals based on the processing of the input binary data.

In operation, the baseband processor 135 may generate data comprising a sequence of bits to be transmitted via a wireless communications medium. The baseband processor 135 may generate a control signal, which may be utilized to configure the RF transmit path 100 to transmit the data by utilizing a specified modulation type. Based on the specified modulation type, the baseband processor may send a portion of the data, an in-phase baseband (IBB) signal, to the DAC 105, and another portion of the data, a quadrature baseband (QBB) signal, to the 107. The DAC 105 may receive a sequence of bits and generate an analog signal comprising a sequence of symbols. The number of bits represented by an individual symbol may be determined based on the specified modulation type. The DAC 107 may similarly generate an analog signal.

The analog signals generated by the DAC 105 and the DAC 107 may comprise undesirable frequency components. The LPF 109 and the LPF 111 may attenuate signal amplitudes associated with these undesirable frequency components in signals generated by the DAC 105 and the DAC 107 respectively. The baseband processor 135 may configure the in-phase up-conversion mixer 117 to select a frequency for the LO117 signal utilized to modulate the filtered signal from the LPF 109. The modulated signal output from the in-phase up-conversion mixer 117 may comprise an I component RF signal. The baseband processor 135 may similarly configure the quadrature up-conversion mixer 119 to generate a Q component RF signal from the filtered signal from the LPF 111. The I component and Q component RF signals may be summed by the adder 120 at the output of the in-phase up-conversion mixer 117 and the quadrature up-conversion mixer 119 to generate a quadrature combined RF signal.

The AS 123 may amplify the quadrature combined RF signal, wherein the level of amplification provided by the AS 123 may be configured based on control signals generated by the baseband processor 135. The PAD 125 may provide a second stage of amplification for the signal generated by the AS 123, and the PA 127 may provide a third stage of amplification for the signal generated by the PAD 125. The amplified signal from the PA 127 may be transmitted to the wireless communications medium via the transmit antenna 133 in instances where the T/R switch 129 is set to "T", or transmit mode.

Figure 2:
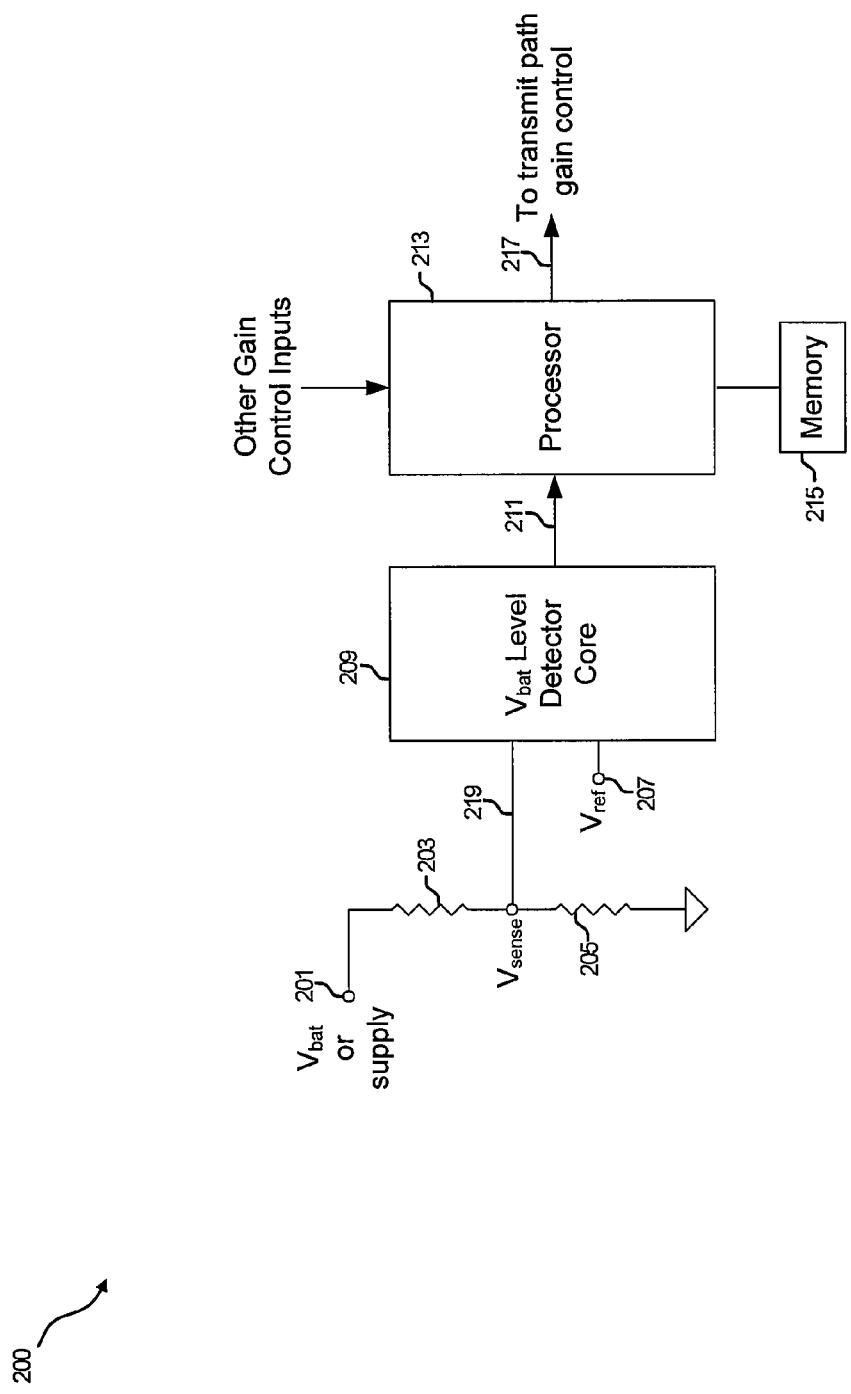
FIG. 2 is a block diagram of an exemplary $V_{bat}$ monitor, in accordance with an embodiment of the invention.

FIG. 2 is a block diagram of an exemplary $V_{bat}$ monitor, in accordance with an embodiment of the invention. Referring to FIG. 2 there is shown a Vbat monitor 200 comprising a $V_{bat}$ level detector core 209, voltage dividing resistors 203 and 205, a memory 215 and a processor 213. The $V_{bat}$ level detector core 209 may comprise suitable circuitry, logic and/or code for receiving a reference input signal, $V_{ref}$ 207, and a sense input, $V_{sense}$ 219, that may be compared to the reference signal $V_{ref}$ 207. The output signal of the $V_{bat}$ level detector core 209 may be a function of the relative magnitude of the two inputs $V_{ref}$ 207 and $V_{sense}$ 219. The voltage $V_{ref}$ 207 may be a constant reference voltage that may be independent of temperature.

The voltage dividing resistors 203 and 205 may reduce $V_{bat}$ 207, the voltage supplied by a battery, to levels appropriate for processing. In one embodiment of the invention, the $V_{bat}$ 207 may be monitored by an integrated power management unit. In another embodiment of the invention, a separate $V_{bat}$ 207 monitor circuit may be utilized. The processor 213 may comprise suitable logic, circuitry, and/or code that may enable controlling of the transmit path 100. The processor 213 may be substantially similar to the processor 155 described with respect to FIG. 1A, and may be enabled to receive output signal 211 generated by the $V_{bat}$ level detector core 209. The processor 213 may receive other gain control inputs in addition to the output signal 211 generated by the $V_{bat}$ level detector core 209. Other gain control inputs may include the transmit power, the voltage standing wave ratio (VSWR) conditions and the modulation type. For example, if higher order modulation types like 64-QAM are utilized, the maximum transmit power in order to satisfy EVM requirements may be less due to linearity requirements as compared to simpler modulation types such as binary phase-shift keying (BPSK). Many variables may be fed into the transmit control loop processor 213 at baseband, which then determines the actual transmit power. The memory 215 may be substantially similar to memory 157 described with respect to FIG. 1A.

In operation, a voltage that may indicate the battery voltage, such as from a PMU 161, as described with respect to FIG. 1A, or directly from a battery or other power supply, $V_{bat}$ 201, may be stepped-down in voltage by the voltage dividing resistors 203 and 205. The stepped-down voltage $V_{sense}$ 219 may be communicated to an input of $V_{bat}$ level detector core 209, and compared to a reference voltage $V_{ref}$ 207. The output signal 211 may be a function of the voltage $V_{sense}$ 219 as compared to the reference voltage $V_{ref}$ 207.

The processor 213 may receive multiple inputs, in addition to the output voltage 211 of $V_{bat}$ level detector core 209, which may be utilized for transmit path 100 control. The overall gain of the transmit path 100 may be a sum of the various gain stages such as the active stages 113, 115 and 123, the PAD 123 and the PA 125 described with respect to FIG. 1B. The gain stages may be designed to meet performance requirements at a specific voltage. An exemplary range of values for a battery voltage, $V_{bat}$ 201, may be 2.4-5.5 volts. If the gain stages may be designed or programmed for a voltage in the lower portion of the 2.4 to 5.5 volt range, the output power may be lower than would be possible in instances when the $V_{bat}$ 201 may be at a higher level than the designed voltage. If the gain stages may be programmed for a voltage in the higher portion of the 2.4 to 5.5 volt range, and in instances when the $V_{bat}$ 201 may fall to the lower portion of the range, such as when a battery gets drained, the output power of transmit path 100 may force the gain stages to operate in a nonlinear fashion degrading ACPR and EVM may be reduced below required levels. Thus it may be desirable to monitor the battery voltage, $V_{bat}$ 201, and adjust gain levels in the gain stages accordingly.

In an exemplary embodiment of the invention, the gain stages may be designed to operate at a voltage that is at the low end of the voltage range supplied by the battery. In instances when the battery voltage, $V_{bat}$ 201, may be higher than the designed voltage, such as when a battery is recently charged, the $V_{bat}$ monitor 200 may sense that $V_{bat}$ 201 may be high, and communicate a corresponding output signal 211 to the processor 213. The processor 213 may generate gain control signal 217 to increase the gain levels of one or more of the gain stages in the transmit path 100 due to the increased output power capability of the gain stages with a higher supply voltage. The required gain levels for a given $V_{bat}$ 201 may be calibrated and stored in a lookup table. The processor 213 may increase the gain levels of one or more of the gain stages in the transmit path 100 to maintain required performance metrics such as adjacent channel power ratio (ACPR), error vector magnitude (EVM), linearity and output power, for example.

Figure 3:
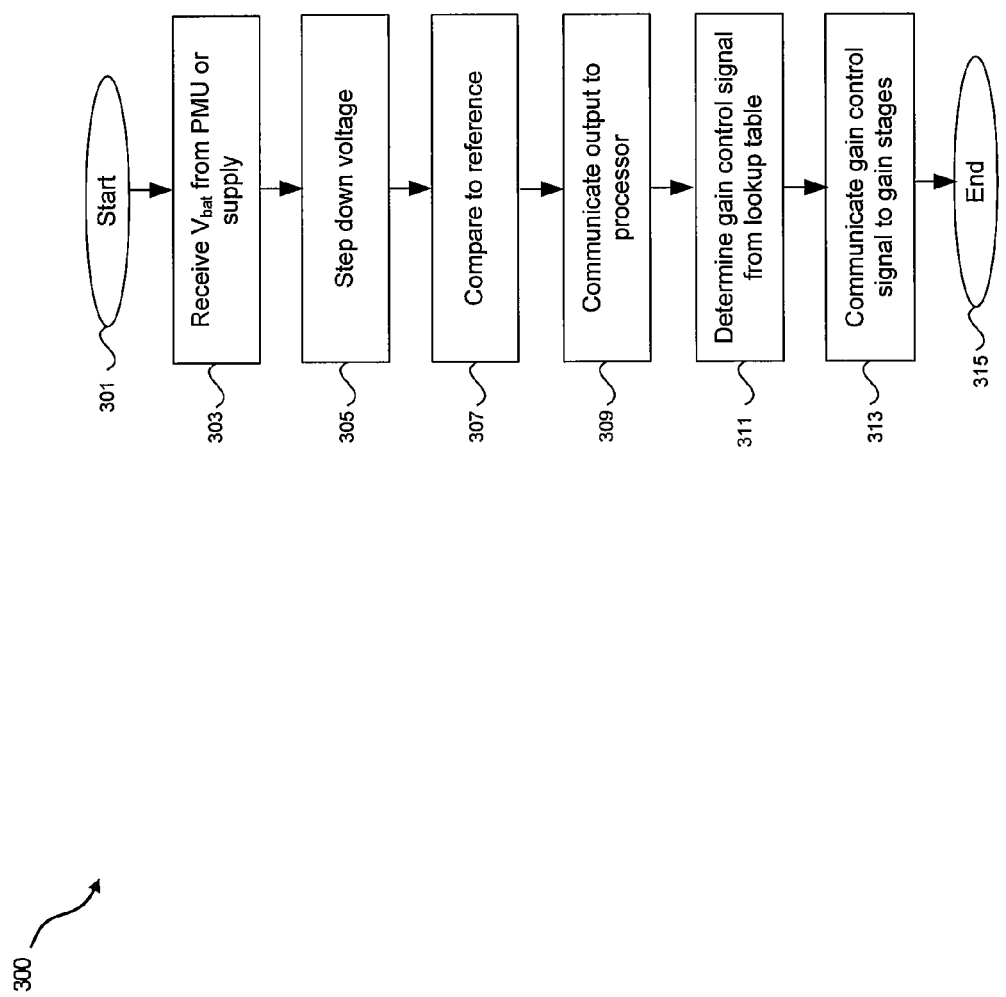
FIG. 3 is a flow diagram illustrating exemplary steps of a $V_{bat}$ monitor process, in accordance with an embodiment of the invention.

FIG. 3 is a flow diagram illustrating exemplary steps of a $V_{bat}$ monitor process, in accordance with an embodiment of the invention. Referring to FIG. 3, there is shown a flow diagram 300. After start step 301, in step 303, the value of voltage $V_{bat}$ 201 may be received from a PMU, battery, or other power supply. In step 305, the voltage $V_{bat}$ 201 may be stepped down to a voltage level that may be processed. In step 307, the voltage $V_{bat}$ 201 may be compared to the reference voltage $V_{ref}$ 207 by the $V_{bat}$ level detector core 209. In step 309, the output signal 201 of the $V_{bat}$ level detector core 209 may be communicated to processor 213. In step 311, the processor 213 may determine a gain control signal 217 from a lookup table. In step 313, the gain control signal may be communicated to the gain stages to apply the appropriate gain in transmit path 100. The process may then proceed to end step 315.

In an embodiment of the invention a method, and system are described for optimizing transmit power of a power amplifier 127 using a $V_{bat}$ monitor, and may comprise adjusting the gain of gain stages of a power amplifier in a transmit path 100 based on a control signal 217. The control signal 217 may be a function of a battery voltage signal 201 derived from a battery voltage that may be used to power a transmit path. The battery voltage signal 201 may be received from a power management unit or derived directly from the battery. The battery voltage signal 201 may be stepped down and compared to a reference voltage 207, the result of which may be utilized to generate the gain control signal 217 by the processor 213. The values for the control signals may be determined over a range of battery voltages and stored in a lookup table.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for controlling a circuit within a transmitter, the method comprising:
adjusting a gain of at least one of a plurality of gain stages in an RF transmit path based on a control signal that is indicative of a measured battery voltage, wherein said gain is adjusted based on a voltage range that enables configuration of each of said at least one of said plurality of gain stages to meet performance requirements,
wherein adjusting the gain comprises increasing the gain of at least one of the plurality of gain stages responsive to the measured battery voltage being higher than a designed voltage corresponding to the plurality of gain stages.

2. The method according to claim 1, comprising receiving a battery voltage signal measured from a battery used to power a transmit path.

3. The method according to claim 2, wherein said battery voltage signal is generated by a power management unit.

4. The method according to claim 2, wherein said battery voltage signal is measured directly from said battery.

5. The method according to claim 2, wherein said control signal is generated based on said measured battery voltage signal.

6. The method according to claim 1, comprising comparing said battery voltage to a reference voltage, wherein the reference voltage is independent of temperature.

7. The method according to claim 6, comprising generating said control signal based on said comparison.

8. The method according to claim 1, wherein a plurality of values for said control signal for a corresponding plurality of said battery voltage values are stored in a lookup table, wherein the plurality of values for said control signal are calibrated to meet performance requirements.

9. The method according to claim 8, comprising determining said control signal that is indicative of said battery voltage from said lookup table.

10. The method according to claim 1, wherein said gain is adjusted to meet performance metrics comprising one or more of transmit power, voltage standing wave ratio, and modulation type.

11. A system for controlling a circuit within a transmitter, the system comprising:
one or more circuits in a chip configured to adjust a gain of at least one of a plurality of gain stages in an RF transmit path based on a control signal that is indicative of a measured battery voltage, wherein said gain is adjusted based on a voltage range that enables configuration of each of said at least one of said plurality of gain stages to meet performance requirements, wherein gain levels associated with values of the control signal are calibrated over a range of battery voltages, and wherein the values are stored in a lookup table.

12. The system according to claim 11, wherein said one or more circuits receives a battery voltage signal measured from a battery used to power a transmit path, and wherein the one or more circuits configured to adjust the gain is further configured to increase the gain of at least one of the plurality of gain stages responsive to a battery corresponding to the measured battery voltage being recently charged.

13. The system according to claim 12, wherein said one or more circuits receives said battery voltage signal generated by a power management unit.

14. The system according to claim 12, wherein said one or more circuits measures said battery voltage signal directly from said supply.

15. The system according to claim 12, wherein said one or more circuits generates said control signal based on said measured battery voltage signal.

16. The system according to claim 11, wherein said one or more circuits compares said battery voltage to a reference voltage.

17. The system according to claim 16, wherein said one or more circuits generates said control signal based on said comparison.

18. The system according to claim 11, wherein said one or more circuits determines said control signal that is indicative of said battery voltage from said lookup table.

19. The system according to claim 11, wherein said one or more circuits adjusts said gain based on one or more of transmit power, voltage standing wave ratio, and modulation type.

20. A machine-readable storage having stored thereon, a computer program having at least one code section for controlling a circuit in a transmitter, the at least one code section being executable by a machine for causing the machine to perform steps comprising:
adjusting a gain of at least one of a plurality of gain stages in an RF transmit path based on a control signal that is indicative of a measured battery voltage, wherein said gain is adjusted based on a voltage range that enables configuration of each of said at least one of said plurality of gain stages to meet performance requirements, wherein adjusting the gain comprises increasing the gain of at least one of the plurality of gain stages responsive to the measured battery voltage being higher than a designed voltage corresponding to the plurality of gain stages, wherein gain levels associated with values of the control signal are calibrated over a battery voltage range based on performance requirements.

21. The machine readable storage according to claim 20, wherein said at least one code section comprises code for receiving a battery voltage signal measured from a battery used to power a transmit path.

22. The machine readable storage according to claim 21, wherein said at least one code section comprises code for receiving said battery voltage signal generated by a power management unit.

23. The machine readable storage according to claim 21, wherein said at least one code section comprises code for measuring said battery voltage signal directly from said battery.

24. The machine readable storage according to claim 21, wherein said at least one code section comprises code for generating said control signal based on said measured battery voltage signal.

25. The machine readable storage according to claim 20, wherein said at least one code section comprises code for comparing said battery voltage to a reference voltage.

26. The machine readable storage according to claim 25, wherein said at least one code section comprises code for generating said control signal based on said comparison.

27. The machine readable storage according to claim 20, wherein said at least one code section comprises code for storing a plurality of values for said control signal for a corresponding plurality of said battery voltage values in a lookup table.

28. The machine readable storage according to claim 27, wherein said at least one code section comprises code for determining said control signal that is indicative of said battery voltage from said lookup table.

29. The machine readable storage according to claim 20, wherein said at least one code section comprises code for adjusting said gain based on one or more of transmit power, voltage standing wave ratio, and modulation type.

* * * * *